United States Patent
Saito et al.

(10) Patent No.: US 10,153,350 B2
(45) Date of Patent: Dec. 11, 2018

(54) SEMICONDUCTOR DEVICE

(71) Applicant: TOYOTA JIDOSHA KABUSHIKI KAISHA, Toyota-shi, Aichi-ken (JP)

(72) Inventors: Jun Saito, Toyota (JP); Tatsuji Nagaoka, Toyota (JP); Sachiko Aoi, Nagakute (JP); Yukihiko Watanabe, Nagakute (JP); Shinichiro Miyahara, Nagoya (JP); Takashi Kanemura, Kariya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/517,289

(22) PCT Filed: Aug. 3, 2015

(86) PCT No.: PCT/JP2015/071977
§ 371 (c)(1),
(2) Date: Apr. 6, 2017

(87) PCT Pub. No.: WO2016/092901
PCT Pub. Date: Jun. 16, 2016

(65) Prior Publication Data
US 2017/0309717 A1  Oct. 26, 2017

(30) Foreign Application Priority Data
Dec. 10, 2014  (JP) .................. 2014-249645

(51) Int. Cl.
*H01L 29/423* (2006.01)
*H01L 29/78* (2006.01)
*H01L 29/06* (2006.01)
*H01L 29/12* (2006.01)
*H01L 29/739* (2006.01)

(52) U.S. Cl.
CPC .......... *H01L 29/4236* (2013.01); *H01L 29/06* (2013.01); *H01L 29/12* (2013.01); *H01L 29/42368* (2013.01); *H01L 29/42376* (2013.01); *H01L 29/78* (2013.01); *H01L 29/7813* (2013.01); *H01L 29/7397* (2013.01)

(58) Field of Classification Search
CPC ................. H01L 27/11582; H01L 27/1157
See application file for complete search history.

(56) References Cited

U.S. PATENT DOCUMENTS

| 5,674,766 A | 10/1997 | Darwish et al. |
| 2007/0290260 A1 | 12/2007 | Adan |
| 2008/0217684 A1* | 9/2008 | Hashimoto ..... H01L 21/823437 257/334 |

(Continued)

FOREIGN PATENT DOCUMENTS

| JP | H08-250731 A | 9/1996 |
| JP | 2004-273849 A | 9/2004 |

(Continued)

*Primary Examiner* — Trang Q Tran
(74) *Attorney, Agent, or Firm* — Oliff PLC

(57) ABSTRACT

The bottom surface of the trench is provided so that a center part of the bottom surface protrudes upward with respect to a peripheral part of the bottom surface in a short direction. A thickness of the gate insulating film covering the peripheral part is thicker than a thickness of the gate insulating film covering the center part.

3 Claims, 3 Drawing Sheets

(56) References Cited

U.S. PATENT DOCUMENTS

| | | |
|---|---|---|
| 2010/0276729 A1 | 11/2010 | Aoi et al. |
| 2014/0097490 A1 | 4/2014 | Takaya et al. |
| 2014/0225155 A1 | 8/2014 | Ogawa |
| 2015/0236127 A1 | 8/2015 | Miyahara et al. |
| 2015/0243749 A1 | 8/2015 | Kurokawa |
| 2016/0064490 A1 | 3/2016 | Hiratsuka et al. |

FOREIGN PATENT DOCUMENTS

| | | | |
|---|---|---|---|
| JP | 2006-344760 A | 12/2006 | |
| JP | 2009-188221 A | 8/2009 | |
| JP | 2013-214658 A | 10/2013 | |
| JP | 2014-033223 A | 2/2014 | |
| JP | 2014-053595 A | 3/2014 | |
| JP | 2014-154739 A | 8/2014 | |
| JP | 2014-209505 A | 11/2014 | |
| JP | 5800097 B2 | 10/2015 | |
| WO | 2009/075200 A1 | 6/2009 | |
| WO | 2012/105170 A1 | 8/2012 | |

\* cited by examiner

SEMICONDUCTOR DEVICE

TECHNICAL FIELD

The present invention relates to a semiconductor device.

BACKGROUND ART

The semiconductor device of Patent Literature 1 (Japanese Patent Application Publication No. 2009-188221) includes a semiconductor substrate provided with trenches, a gate insulating film covering an inner surface of each of the trenches, and a gate electrode arranged in each of the trenches. The semiconductor substrate includes n-type source regions in contact with the gate insulating film, p-type base regions provided below the source regions and being in contact with the gate insulating film, and an n-type drift region provided below the base regions and being in contact with the gate insulating film. A bottom surface of each of the trenches is provided so that a center part of the bottom surface protrudes upper than peripheral parts of the bottom surface.

In the semiconductor device of Patent Literature 1, depletion layers are formed by p-n junctions between the base regions and the drift region. The depletion layers extend into the drift region to reach peripheries of the bottom surfaces of the trenches. Further, the depletion layers expand from the peripheral part sides to the center part side of the bottom surface of each of the trenches. In the above-described configuration, the center part of the bottom surface of each of the trench protrudes up, and hence voltage is applied to the drift region immediately below the bottom surface of each of the trenches in two directions from both the peripheral part sides to the center part side. Thus, depletion in the drift region immediately below the bottom surface of the trench is promoted. With this, a capacity of the depletion layer formed below the bottom surface of the trench decreases, and hence a feedback capacity decreases. Therefore, switching loss of the semiconductor device can be reduced.

SUMMARY OF INVENTION

Technical Problem

In the semiconductor device of Patent Literature 1, when a thickness of the gate insulating film covering the bottom surface of the trench is thinned, the depletion in the drift region immediately below the bottom surface of the trench can be further promoted. However, when the gate insulating film at the bottom surface of the trench is merely thinned, a capacity of the gate insulating film increases, and hence the feedback capacity increases. As a result, the switching loss of the semiconductor device increases. In addition, when the gate insulating film is merely thinned, breakdown voltage of the gate insulating film decreases. As a result, a life of the gate insulating film is shortened.

It is an object of the present application to provide, in view of the circumstances, a semiconductor device capable of restraining switching toss while securing breakdown voltage of a gate insulating film covering a bottom surface of each trench.

Solution to Technical Problem

A semiconductor device herein disclosed may comprise a semiconductor substrate including a trench provided in an upper surface of the semiconductor substrate; a gate insulating film covering an inner surface of the trench; and a gate electrode arranged in the trench. The semiconductor substrate may comprise a first conductivity type first region being in contact with the gate insulating film covering a side surface of the trench, a second conductivity type second region provided below the first region and being in contact with the gate insulating film covering a side surface of the trench, and a first conductivity type third region provided below the second region and being in contact with the gate insulating film covering a side surface and a bottom surface of the trench. The bottom surface of the trench may be provided so that a center part of the bottom surface protrudes upward with respect to a peripheral part of the bottom surface in a short direction. A thickness of the gate insulating film covering the peripheral part may be thicker than a thickness of the gate insulating film covering the center part.

With such a configuration, a depletion layer extends from an interface between the second conductivity type second region and the first conductivity type third region to a surrounding of the interface. The depletion layer extends into the third region to reach a periphery of the bottom surface of the trench. Further, the depletion layer expands from the peripheral part side of the bottom surface of the trench to the center part side of the bottom surface. In the above-described semiconductor device, the bottom surface of the trench is provided so that the center part of the bottom surface protrudes upper than the peripheral part of the bottom surface. Thus, when the depletion layer expands to the center part side of the bottom surface of the trench, equipotential lines (planes) extend in conformity with a shape of the bottom surface of the trench. In this state, since the center part of the bottom surface of the trench protrudes up and the peripheral part of the bottom surface protrudes down, an electric field concentrates near the protruding peripheral part. However, in the above-described semiconductor device, the thickness of the gate insulating film covering the peripheral part of the bottom surface of the trench is thicker than the thickness of the gate insulating film covering the center part. With this, breakdown voltage of the gate insulating film at the peripheral part of the bottom surface of the trench can be increased, and deterioration of the gate insulating film can be restrained.

Meanwhile, since the gate insulating film at the center part of the bottom surface of the trench is thinner than at the peripheral part, depletion in the third region immediately below the center part can be promoted. With this, since a capacity of the depletion layer formed immediately below the center part decreases, and a feedback capacity decreases, increase in switching loss of the semiconductor device can be restrained. Further, when the depletion in the third region immediately below the center part is promoted, a high electric field is not applied to the gate insulating film at the center part. With this, even when the gate insulating film covering the center part of the bottom surface of the trench is thin, the gate insulating film can withstand the electric field. As described above, according to this semiconductor device, switching loss can be restrained while securing the breakdown voltage of the gate insulating film covering the bottom surface of the trench.

DESCRIPTION OF EMBODIMENTS

Figure 1:
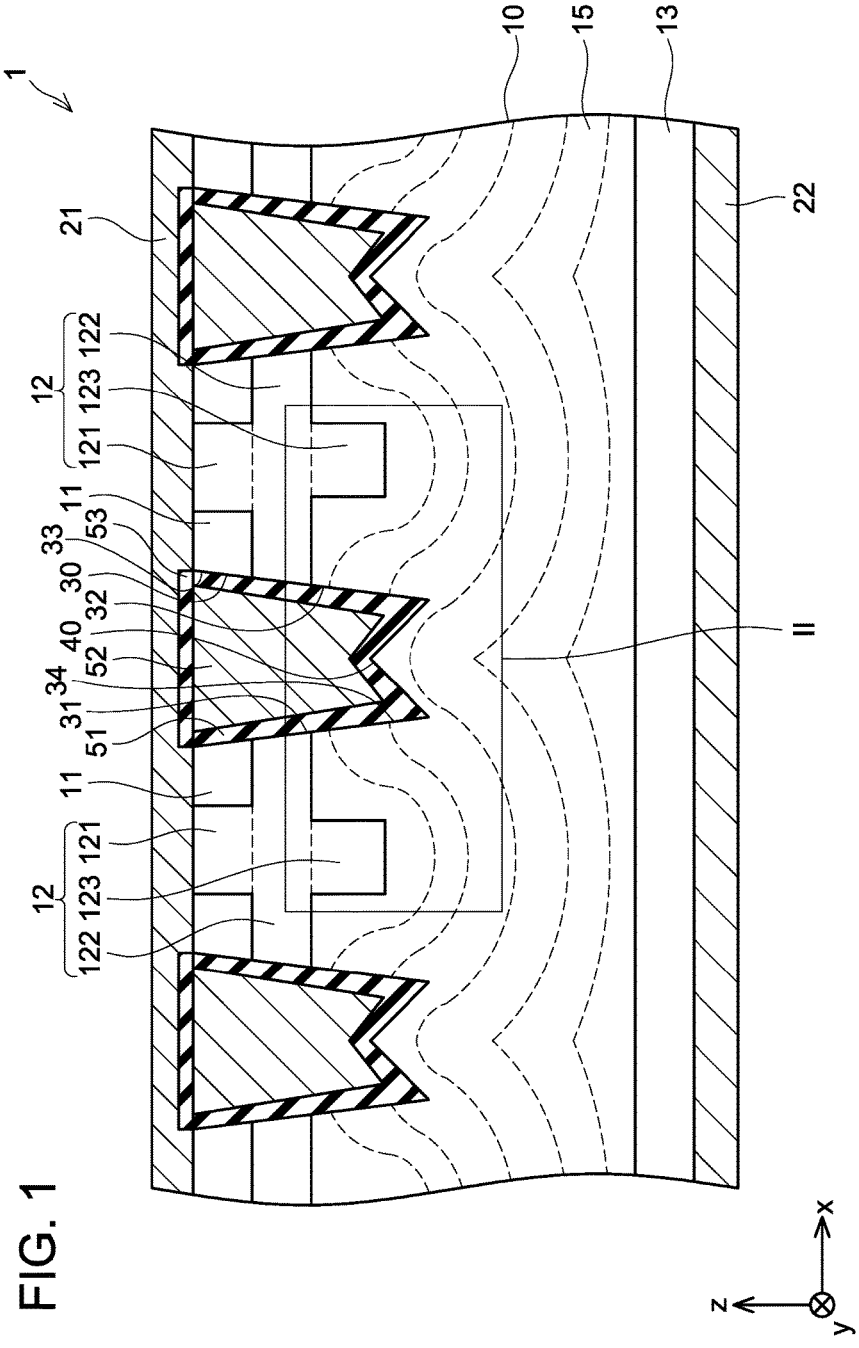
FIG. 1 is a sectional view of a semiconductor device.
Figure 2:
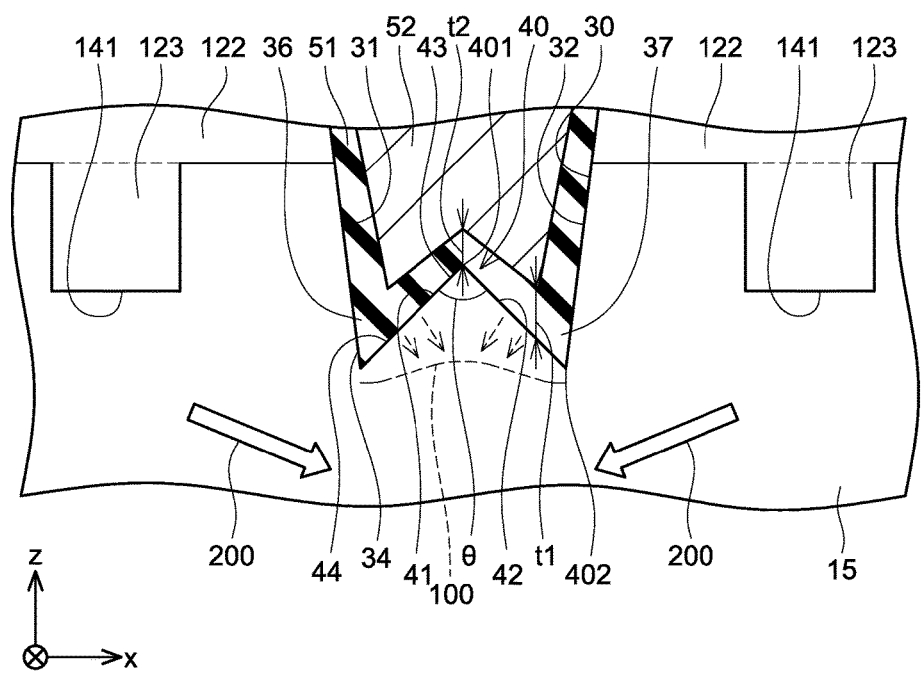
FIG. 2 is an enlarged view of a main part II in FIG. 1.

In the following, an embodiment will be described with reference to the accompanying drawings. As illustrated in FIG. 1 and FIG. 2, a semiconductor device 1 includes a semiconductor substrate 10, an upper surface electrode 21 arranged on an upper surface of the semiconductor substrate 10, and a lower surface electrode 22 arranged on a lower surface of the semiconductor substrate 10. Note that, the dotted lines in FIG. 1 schematically indicate equipotential lines (planes) in the semiconductor substrate 10 when gate electrodes 52 are at an OFF potential, the upper surface electrode 21 is at a low potential, and when the lower surface electrode 22 is at a high potential.

The upper surface electrode 21 covers the upper surface of the semiconductor substrate 10. The lower surface electrode 22 covers the lower surface of the semiconductor substrate 10. The upper surface electrode 21 and the lower surface electrode 22 are made of metals such as aluminum (Al) and copper (Cu) or the like.

The semiconductor substrate 10 is made of silicon carbide (SiC). Alternatively, the semiconductor substrate 10 may be made of, for example, silicon (Si) or gallium nitride (GaN). In the semiconductor substrate 10, semiconductor elements are provided. In this embodiment, a vertical MOSFET (Metal Oxide Semiconductor Field Effect Transistor) is exemplified as the semiconductor elements.

Trenches 30 are provided on the upper surface of the semiconductor substrate 10. Further, the semiconductor substrate 10 includes source regions 11 (example of a first region), base regions 12 (example of a second region) provided below the source regions 11, a drift region 15 (example of a third region) provided below the base regions 12, and a drain region 13 provided below the drift region 15.

The trenches 30 extend along a depth direction (z-direction) of the semiconductor substrate 10. The trenches 30 extend from the upper surface of the semiconductor substrate 10 to a depth reaching the drift region 15 through the source regions 11 and the base regions 12. An inner surface of each of the trenches 30 is provided with a gate insulating film 51. In each of the trenches 30, a gate electrode 52 is arranged. The trenches 30 each include a first side surface 31, a second side surface 32, and a bottom surface 40.

The first side surface 31 and the second side surface 32 of the trench 30 face each other in a short direction (x-direction) of the trench 30. The first side surface 31 and the second side surface 32 are slanted. The first side surface 31 and the second side surface 32 come closer to each other along the depth direction (z-direction) from the upper surface side of the semiconductor substrate 10. A distance between the first side surface 31 and the second side surface 32 is shorter in a lower part than in an upper part in the depth direction of the trench 30. A width of a bottom part 34 of the trench 30 is narrower than a width of an opening part 33.

The bottom surface 40 of the trench 30 is provided between the first side surface 31 and the second side surface 32. The bottom surface 40 is formed into a mountain-shape (protruding shape). As illustrated in FIG. 2, the bottom surface 40 includes a center part 43 and peripheral parts 44 along the short direction (x-direction). The peripheral parts 44 are located on the side-surface 31 and 32 sides than the center part 43. The bottom surface 40 is formed so that the center part 43 protrudes upward with respect to the peripheral parts 44 along the short direction (x-direction). In other words, the center part 43 of the bottom surface 40 is located at a position shallower than the peripheral parts 44 in the depth direction (z-direction).

The bottom surface 40 includes a first slant surface 41 and a second slant surface 42. The first slant surface 41 extends from the center part 43 of the bottom surface 40 to the first side surface 31. The first slant surface 41 is continuous with the first side surface 31. The second slant surface 42 extends from the center part 43 of the bottom surface 40 to the second side surface 32. The second slant surface 42 is continuous with the second side surface 32. At the center part 43 of the bottom surface 40, an angle θ formed by the first slant surface 41 and the second slant surface 42 is preferably not larger than 90°. A first corner part 36 is provided between the first side surface 31 and the first slant surface 41. A second corner part 37 is provided between the second side surface 32 and the second slant surface 42.

The gate insulating film 51 covers the first side surface 31, the second side surface 32, and the bottom surface 40. The gate insulating film 51 can be formed by depositing an oxide film on the inner surface of the trench 30. The gate insulating film 51 is a film made of, for example, TEOS (Tetra-ethyl Ortho-silicate). At the first corner part 36 of the trench 30, the oxide film starts to deposit from the first side surface 31 and the first slant surface 41 of the trench 30. With this, a thickness of the gate insulating film 51 at the first corner part 36 is thick. Similarly, at the second corner part 37 of the trench 30, the oxide film starts to deposit from the second side surface 32 of the trench 30 and the second slant surface 42. With this, a thickness of the gate insulating film 51 at the second corner part 37 becomes thick. A thickness t1 of the gate insulating film 51 covering the peripheral part 44 of the bottom surface 40 of the trench 30 is thicker than a thickness t2 of the gate insulating film 51 covering the center part 43 of the bottom surface 40.

The gate electrode 52 is made of, for example, aluminum or polysilicon. The gate electrode 52 is accommodated inner than the gate insulating film 51. The gate electrode 52 is insulated from the semiconductor substrate 10 by the gate insulating film 51. An interlayer insulating film 53 is arranged on the gate electrode 52. The interlayer insulating film 53 is provided between the gate electrode 52 and the upper surface electrode 21, and insulates those electrodes from each other.

The source regions 11 are n-type regions. The source regions 11 have a high impurity density. The source regions 11 are provided on a surface layer part of the semiconductor substrate 10. The source regions 11 are each formed in islands in a range exposed on the upper surface of the semiconductor substrate 10. The source regions 11 are in contact with a parts of the gate insulating film 51 covering the first side surface 31 and the second side surface 32. The source regions 11 are in contact with the upper surface electrode 21. The source regions 11 are in ohmic contact with the upper surface electrode 21, and electrically conducted to the upper surface electrode 21.

The base regions 12 are p-type regions. The base regions 12 are in contact with the gate insulating films 51. The base regions 12 each include a base contact region 121, a low-density base region 122, and a protruding region 123. The base contact region 121 has a high impurity density. An impurity density of each of the low-density base region 122 and the protruding region 123 is lower than the impurity density of the base contact region 121.

The base contact regions 121 are provided on the surface layer part of the semiconductor substrate 10. The base contact regions 121 are formed in islands in a range exposed on the upper surface of the semiconductor substrate 10. The base contact regions 121 are in contact with the upper surface electrode 21. The base contact regions 121 are in ohmic contact with the upper surface electrode 21, and electrically conducted to the upper surface electrode 21, The low-density base regions 122 are provided below the source regions 11 and the base contact regions 121. The low-density base regions 122 separate the source regions 11 from the drift region 15. Below the source regions 11, the low-density base regions 122 are in contact with the gate insulating film 51 covering the first side surface 31 and the second side surface 32.

The protruding regions 123 are provided below the low-density base regions 122. The protruding regions 123 protrude toward the drift region 15 side. The protruding regions 123 penetrate into the drift region 15. The protruding regions 123 are provided at positions separate from the trench 30. In the short direction (x-direction) of the trench 30, the protruding regions 123 are provided on both sides of the trench 30. A lower end 141 of each of the protruding regions 123 is located at a position deeper than an upper end 401 of the bottom surface 40 of the trench 30. In other words, the center part 43 of the bottom surface 40 of the trench 30 is provided at a position shallower than the lower end 141 of each of the protruding regions 123. In addition, the lower end 141 of each of the protruding regions 123 is located at a position-shallower than lower ends 402 of the bottom surface 40 of the trench 30. In other words, the peripheral parts 44 of the bottom surface 40 of the trench 30 are provided at a position deeper than the lower end 141 of each of the protruding regions 123.

The drift region 15 is an n-type region. The drift region 15 has a low impurity density. The drift region 15 is in contact with the gate insulating film 51. The drift region 15 is provided around the protruding regions 123 and around the bottom part 34 of the trench 30. The drift region 15 is in contact with parts of the gate insulating film 51 covering both the sides surfaces 31 and 32 and the bottom surface 40 of the trench 30.

The drain region 13 is an n-type region. The drain region 13 has a high impurity density. The drain region 13 is provided in a range exposed on the lower surface of the semiconductor substrate 10. The drain region 13 is in contact with the lower surface electrode 22. The drain region 13 is in ohmic contact with the lower surface electrode 22, and electrically conducted to the lower surface electrode 22.

At the time of operating the semiconductor device 1, a potential higher than that at the upper surface electrode 21 is applied to the lower surface electrode 22. In this state, when a potential not lower than a threshold is applied to the gate electrodes 52, channels are formed in the low-density base regions 122. With this, current flows from the lower surface electrode 22 toward the upper surface electrode 21 through the drain region 13, the drift region 15, the channels, and the source regions 11. In other words, the MOSFET is turned ON. When the potential at the gate electrodes 52 is reduced to not higher than the threshold, the channels disappear, and the MOSFET is turned OFF. When the MOSFET is turned OFF, an anti-voltage is applied to junctions between the p-type base regions 12 and the n-type drift region 15. With this, depletion layers are formed to extend from interfaces therebetween to their surroundings. The depletion layers extend into the drift region 15 to reach peripheries of the bottom surface 40 of the trench 30.

As indicated by the arrows 200 in FIG. 2, the depletion layers expand from the peripheral part 44 sides to the center part 43 side of the bottom surface 40 of the trench 30. In the above-described semiconductor device 1, the bottom surface 40 of the trench 30 is formed so that the center part 43 protrudes upper than the peripheral parts 44. With this, when the depletion layers expand to the center part 43 side of the bottom surface 40 of the trench 30, as illustrated in FIG. 1, the equipotential lines (planes) extend in conformity with the shape of the bottom surface 40 of the trench 30.

In the above-described semiconductor device 1, since the center part 43 of the bottom surface 40 of the trench 30 protrudes upward, and the peripheral parts 44 protrude downs, an electric field concentrates near the protruding peripheral parts 44. However, in the above-described semiconductor device 1, the thickness t1 of the gate insulating film 51 covering the peripheral part 44 of the bottom surface 40 of the trench 30 is thicker than the thickness t2 of the gate insulating film 51 covering the center part 43. In other words, a thickness of the gate insulating film 51 at the first corner part 36 and the second corner part 37 of the trench 30 is thick. As a result, the gate insulating film 51 at the first corner part 36 and the second corner part 37 can withstand the electric field.

Further, according to the above-described semiconductor device 1, since the gate insulating film 51 covering the center part 43 of the bottom surface 40 of the trench 30 is thinner than at the peripheral parts 44, depletion in the drift region 15 immediately below the center part 43 can be promoted. With this, a capacity of a depletion layer 100 formed immediately below the center part 43 decreases, and a feedback capacity decreases. Therefore, increase in switching loss of the semiconductor device 1 can be restrained. Further, when the depletion in the drift region 15 immediately below the center part 43 is promoted, a high electric field is less liable to be generated below the center part 43. With this, even when the gate oxide film 51 covering the center part 43 of the bottom surface 40 of the trench 30 is thin, the gate oxide film 51 at the center part 43 can withstand the electric field. As described above, in the semiconductor device 10, the gate insulating film 51 covering the bottom surface 40 of the trench 30 has sufficient breakdown voltage, and switching loss can be restrained in comparison with that in the related art.

Still further, in the above-described semiconductor device 1, the angle θ formed by the first slant surface 41 and the second slant surface 42 of the bottom surface 40 of the trench 30 is not more than 90°. When the angle formed by the first slant surface 41 and the second slant surface 42 is acute in this way, the high electric field is less liable to be generated in the drift region 15 between the first slant surface 41 and the second slant surface 42, and intervals between the equipotential lines become wider near the bottom surface 40 of the trench 30. With this, the feedback capacity between the gate electrode 52 and the drift region 15 can be reduced. As a result, the switching loss of the semiconductor device 1 can be reduced.

Yet further, in the above-described semiconductor device 1, the base regions 12 each include the protruding region 123 protruding to the drift region 15 side at the position separate from the gate insulating film 51. With this, the depletion layers extend from the interfaces between the protruding regions 123 and the drift region 15 to their surroundings, and the depletion around the bottom surface 40 of the trench 30 can be promoted. In addition, the electric field is not intensively generated on either of the peripheral part 44 sides and the center part 43 side of the bottom surface 40 of the trench 30, and hence intensity of the electric field is balanced. Thus, the electric field is uniformly generated around the gate insulating film 51 covering the peripheral parts 44 of the bottom surface 40 of the trench 30 and around the gate insulating film 51 covering the center part 43, and application of uneven load on the gate insulating film can be restrained. With this, deterioration of the gate insulating film 51 covering the bottom surface 40 of the trench 30 can be restrained.

Figure 3:
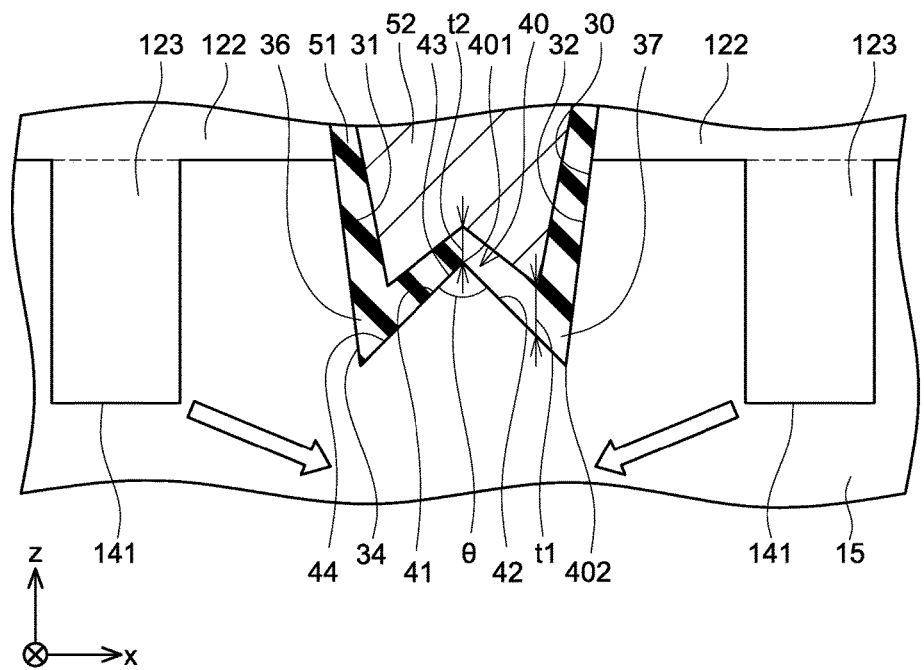
FIG. 3 is an enlarged view of a main part of a semiconductor device according to another embodiment.

With regard to the above description of the one embodiment herein, specific configurations are not limited to this embodiment. For example, according to another embodiment, as illustrated in FIG. 3, the bottom surface 40 of the trench 30 may be provided at a position shallower than the lower ends 141 of the protruding regions 123. The lower ends 141 of the protruding regions 123 are provided at a position deeper than the lower ends 402 of the trench 30. With such a configuration, the electric field in the drift region 15 near the first corner part 36 and the second corner part 37 of the trench 30 can be alleviated. With this, degradation of the breakdown voltage of the gate insulating film 51 at the first corner part 36 and the second corner part 37 of the trench 30 can be restrained.

Further, in the above-described embodiment, the MOSFET is described as an example of the semiconductor element. However, the present disclosure is not limited to this configuration. According to still another embodiment, an IGBT (Insulated Gate Bipolar Transistor) may be employed as a semiconductor element.

Specific examples of the present invention have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

Some of the features characteristic to below-described embodiments will herein be listed. It should be noted that the respective technical elements are independent of one another, and are useful solely or in combinations. The combinations thereof are not limited to those described in the claims as originally filed.

In the semiconductor device according to one embodiment, the bottom surface of the trench may comprise a first slant surface extending from the center part to one side surface of the trench and a second slant surface extending from the center part to another side surface of the trench. An angle formed by the first slant surface and the second slant surface may be not more than 90 degrees.

In the semiconductor device according to one embodiment, the second region may comprise a protruding region protruding toward the third region side at a position separate from the gate insulating film.

In the semiconductor device according to one embodiment, the bottom surface of the trench may be provided at a position shallower than a lower end of the protruding region.

REFERENCE SIGNS LIST

1: semiconductor device
10: semiconductor substrate
11: source regions
12: base regions
13: drain region
15: drift region
21: upper surface electrode
22: lower surface electrode
30: trench
31: first side surface
32: second side surface
33: opening part
34: bottom part
36: first corner part
37: second corner part
40: bottom surface
41: first slant surface
42: second slant surface
43: center part
44: peripheral part
51: gate insulating film
52: gate electrode
53: interlayer insulating film
121: base contact region
122: low-density base region
123: protruding region
141: lower end
401: upper end
402: lower end

The invention claimed is:

1. A semiconductor device comprising:
a semiconductor substrate including a trench provided in an upper surface of the semiconductor substrate;
a gate insulating film covering an inner surface of the trench and
a gate electrode arranged in the trench;
wherein:
the semiconductor substrate comprises:
a first conductivity type first region being in contact with the gate insulating film covering both side surfaces of the trench;
a second conductivity type second region provided below the first region and being in contact with the gate insulating film covering both side surfaces of the trench; and
a first conductivity type third region provided below the second region and being in contact with the gate insulating film covering both side surfaces and a bottom surface of the trench,
the bottom surface of the trench is provided so that a center part of the bottom surface protrudes upward with respect to a peripheral part of the bottom surface in a short direction,
a thickness of the gate insulating film covering the peripheral part is thicker than a thickness of the gate insulating film covering the center part,
the bottom surface of the trench comprises a first slant surface extending from the center part to one side surface of the trench and a second slant surface extending from the center part to another side surface of the trench, and
an angle formed by the first slant surface and the second slant surface is not more than 90 degrees.

2. The semiconductor device according to claim 1, wherein the second region comprises a protruding region protruding toward the third region side at a position separate from the gate insulating film.

3. The semiconductor device according to claim 2, wherein the bottom surface of the trench is provided at a position shallower than a lower end of the protruding region.

* * * * *